(12) United States Patent
Lee et al.

(10) Patent No.: US 10,424,561 B2
(45) Date of Patent: *Sep. 24, 2019

(54) INTEGRATED CIRCUIT STRUCTURES WITH RECESSED CONDUCTIVE CONTACTS FOR PACKAGE ON PACKAGE

(71) Applicant: Intel Corporation, Santa Clara, CA (US)

(72) Inventors: Kyu-Oh Lee, Chandler, AZ (US); Islam A. Salama, Scottsdale, AZ (US); Ram S. Viswanath, Phoenix, AZ (US); Robert L. Sankman, Phoenix, AZ (US); Babak Sabi, Hillsboro, OR (US); Sri Chaitra Jyotsna Chavali, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/863,821

(22) Filed: Jan. 5, 2018

(65) Prior Publication Data
US 2018/0226381 A1     Aug. 9, 2018

Related U.S. Application Data

(63) Continuation of application No. 15/038,008, filed as application No. PCT/US2015/037814 on Jun. 25, 2015, now Pat. No. 9,865,568.

(51) Int. Cl.
*H01L 23/00* (2006.01)
*H01L 23/13* (2006.01)
(Continued)

(52) U.S. Cl.
CPC .......... *H01L 25/0657* (2013.01); *H01L 23/13* (2013.01); *H01L 23/48* (2013.01);
(Continued)

(58) Field of Classification Search
CPC . H05O 1/183; H05O 3/06; H05O 1/11; H05O 2/28; H05O 3/40; H05O 1/03;
(Continued)

(56) References Cited

U.S. PATENT DOCUMENTS 7,583,871 B1   9/2009 Bchir et al.
9,865,568 B2 * 1/2018 Lee .......................... H01L 23/48
(Continued)

FOREIGN PATENT DOCUMENTS

WO    WO 2016/209243 A1    12/2016

OTHER PUBLICATIONS

International Search Report and Written Opinion dated Mar. 25, 2016 for International Application No. PCT/US2015/037814, 15 pages.
(Continued)

*Primary Examiner* — Alexander O Williams
(74) *Attorney, Agent, or Firm* — Schwabe, Williamson & Wyatt, P.C.

(57) ABSTRACT

An integrated circuit (IC) structure includes a first IC package (ICP), including a first resist surface provided with a first plurality of conductive contacts (CCs), a first recess including a second resist surface disposed at a bottom of the recess and having a second plurality of CCs, and a second recess, including a third resist surface disposed at a bottom of the recess and provided with a fourth plurality of CCs. The IC structure further includes an IC component with a first surface and a second surface, the second surface having a third plurality of CCs coupled to the second plurality of CCs of the first ICP. The IC structure further includes a second ICP having a first surface and a second surface, with one or more CCs located at the second surface and coupled to at least one of the first plurality of CCs of the first ICP.

25 Claims, 15 Drawing Sheets

(51) Int. Cl.
*H01L 23/48* (2006.01)
*H01L 25/10* (2006.01)
*H01L 23/498* (2006.01)
*H01L 25/065* (2006.01)

(52) U.S. Cl.
CPC .. *H01L 23/49827* (2013.01); *H01L 23/49838* (2013.01); *H01L 24/05* (2013.01); *H01L 24/11* (2013.01); *H01L 24/17* (2013.01); *H01L 25/105* (2013.01); *H01L 23/49816* (2013.01); *H01L 23/49822* (2013.01); *H01L 2224/0401* (2013.01); *H01L 2224/05147* (2013.01); *H01L 2224/16225* (2013.01); *H01L 2224/97* (2013.01); *H01L 2225/06517* (2013.01); *H01L 2225/1023* (2013.01); *H01L 2225/1058* (2013.01); *H01L 2225/1088* (2013.01); *H01L 2924/15311* (2013.01)

(58) Field of Classification Search
CPC ..... B23K 26/40; H01L 25/065; H01L 23/498; H01L 23/00; H01L 25/0657; H01L 23/49827; H01L 23/49838; H01L 5/0657; H01L 24/11; H01L 24/05; H01L 24/17; H01L 2225/06517; H01L 2224/0401; H01L 2224/05147; H01L 23/48; H01L 23/13; H01L 25/105; H01L 2224/16225; H01L 2225/1058; H01L 2924/15311; H01L 2225/1088; H01L 23/49816; H01L 23/49822; H01L 2225/1023; H01L 2224/97
USPC .................. 257/774, 773; 174/251; 264/400
See application file for complete search history.

(56) References Cited

U.S. PATENT DOCUMENTS

| | | | |
|---|---|---|---|
| 9,978,731 B1* | 5/2018 | Kim ..................... | H01L 25/105 |
| 2005/0087850 A1 | 4/2005 | Nishikawa et al. | |
| 2005/0258548 A1 | 11/2005 | Ogawa et al. | |
| 2006/0175695 A1 | 8/2006 | Lee | |
| 2007/0117275 A1 | 5/2007 | DCamp et al. | |
| 2008/0169123 A1 | 7/2008 | Sakamoto et al. | |
| 2009/0152233 A1 | 6/2009 | Cho et al. | |
| 2010/0019370 A1 | 1/2010 | Pressel et al. | |
| 2011/0068444 A1 | 3/2011 | Chi et al. | |
| 2011/0278741 A1 | 11/2011 | Chua et al. | |
| 2012/0104623 A1 | 5/2012 | Pagaila et al. | |
| 2013/0020120 A1 | 1/2013 | Ishihara et al. | |
| 2013/0192884 A1* | 8/2013 | Furutani ................ | H05K 1/185 174/258 |
| 2013/0292850 A1 | 11/2013 | Chua et al. | |
| 2015/0022985 A1* | 1/2015 | Na .......................... | H05K 1/183 361/763 |
| 2015/0092356 A1 | 4/2015 | Yoshikawa et al. | |
| 2015/0098204 A1* | 4/2015 | Yoshikawa ........... | H05K 1/144 361/767 |
| 2015/0145142 A1* | 5/2015 | Lin ....................... | H01L 25/50 257/774 |
| 2015/0156880 A1* | 6/2015 | Daizo ................... | H05K 1/183 174/251 |
| 2015/0156881 A1 | 6/2015 | Shimizu et al. | |
| 2015/0279817 A1 | 10/2015 | Zhang et al. | |
| 2016/0233166 A1 | 8/2016 | Teh et al. | |
| 2016/0254237 A1 | 9/2016 | Kim et al. | |
| 2016/0276307 A1 | 9/2016 | Lin | |
| 2017/0053878 A1* | 2/2017 | Kajihara ........... | H01L 23/49822 |
| 2017/0170109 A1* | 6/2017 | Lee .................... | H01L 21/4853 |
| 2017/0207196 A1* | 7/2017 | Lee ........................ | H01L 23/48 |
| 2017/0372980 A1* | 12/2017 | Kurahashi ........... | H01L 21/4857 |
| 2018/0082988 A1* | 3/2018 | Cheng ............... | H01L 23/49811 |
| 2018/0108639 A1* | 4/2018 | Kang ................. | H01L 21/02063 |

OTHER PUBLICATIONS

International Search Report and Written Opinion dated Mar. 25, 2016 for International Application No. PCT/US2015/037808, 15 pages.
Non-Final Office Action dated Jul. 28, 2017 for U.S. Appl. No. 15/038,001, 21 pages.
Final Office Action dated Feb. 8, 2018 for U.S. Appl. No. 15/038,001, 16 pages.
International Report on Patentability dated Jan. 4, 2018 for International Application No. PCT/US2015/037814, 8 pages.
International Report on Patentability dated Jan. 4, 2018 for International Application No. PCT/US2015/037808, 7 pages.
Non-Final Office Action dated May 5, 2017 for U.S. Appl. No. 15/038,008, 21 pages.
Notice of Allowance dated Aug. 29, 2017 for U.S. Appl. No. 15/038,008, 5 pages.
Non-Final Office Action dated Sep. 10, 2018 for U.S. Appl. No. 15/038,001, 9 pages.
Final Office Action dated Mar. 21, 2019 for U.S. Appl. No. 15/038,001, 22 pages.
Extended Search Report dated Dec. 7, 2018 for European Application No. 15896531.9, 8 pages.
Office Action dated Dec. 18, 2018 for Japanese Application No. 2017-559635, 16 pages.
Office Action dated May 29, 2019 for Japanese Application No. 2017-553211, 15 pages.

* cited by examiner

INTEGRATED CIRCUIT STRUCTURES WITH RECESSED CONDUCTIVE CONTACTS FOR PACKAGE ON PACKAGE

CROSS REFERENCE TO RELATED APPLICATIONS

The present application is a continuation of U.S. application Ser. No. 15/038,008, filed May 19, 2016, entitled "INTEGRATED CIRCUIT STRUCTURES WITH RECESSED CONDUCTIVE CONTACTS FOR PACKAGE ON PACKAGE" which is a national phase entry under 35 U.S.C. § 371 of International Application No. PCT/US2015/037814, filed Jun. 25, 2015, entitled "INTEGRATED CIRCUIT STRUCTURES WITH RECESSED CONDUCTIVE CONTACTS FOR PACKAGE ON PACKAGE", which designated, among the various States, the United States of America. The contents of U.S. application Ser. No. 15/038,008 and International Application No. PCT/US2015/037814 are hereby incorporated by reference in their entireties for all purposes.

TECHNICAL FIELD

The present disclosure relates generally to the field of integrated circuits (ICs), and more particularly, to IC structures with recessed conductive contacts for package on package (PoP).

BACKGROUND

Package on package (PoP) structures are sometimes used to reduce the footprint of integrated circuit devices. However, the height of conventional PoP structures may be too great for small form factor settings, such as smartphones.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
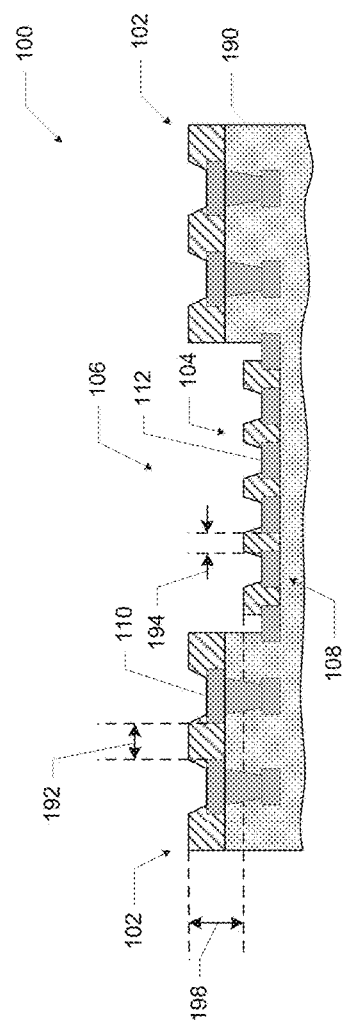
FIG. 1 is a cross-sectional side view of a portion of an IC package, in accordance with various embodiments.

Disclosed herein are integrated circuit (IC) structures with recessed conductive contacts for package on package (PoP) and related structures and methods. Various ones of the embodiments disclosed herein may enable IC structures in which one IC package is disposed in a recess of another IC package, and the IC packages are electrically coupled in the recess via conductive contacts having a fine pitch.

PoP structures have been used to provide high-density logic (e.g., by stacking memory components) for small form factor devices, such as smartphones and tablet computers. However, existing PoP interconnect technologies are not able to scale to provide the memory bandwidth required for new generations of computing devices (e.g., those with multicore application processors). For example, attempts have been made to "sandwich" a memory device between a first package and a second package by using very tall copper pillars or posts to connect the first package and second package with enough clearance for the memory device in between. This approach requires the use of a copper plating process to form the copper pillars, and is both expensive and time-consuming. Other attempts have been made to accommodate a memory device between first and second packages by connecting the two packages with a structure formed from a first layer of solder bumps on the first package, an interposer coupled to the first layer of solder bumps, and a second layer of solder bumps on the interposer (to which the second package is coupled); in such an approach, the interposer is used to expand the clearance between the first and second packages. This approach is cumbersome because of the need to separately manufacture the interposer and assemble the complex PoP structure. Additionally, as the pitch decreases and the conductive contacts become closer together, the use of solder balls in this approach presents a bridging risk during manufacturing. The risk of bridging and the likelihood of failure during package warpage also limits the utility of existing interconnect technologies (such as stacking with smaller size solder balls on top of through-molded vias) for fine pitch applications.

Various ones of the embodiments disclosed herein take an entirely different approach: employ a recess in a bottom package to create enough space so that another component can be inserted. Some such embodiments may reduce the overall height of an IC structure and enable high-density interconnects without requiring expensive and complex manufacturing operations.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "package" may refer to an integrated circuit component having a supportive casing and electrical contacts that connects the component to a circuit board.

FIG. 1 is a cross-sectional side view of a portion of an IC package 100, in accordance with various embodiments. The IC package 100 may have a first resist surface 102 and a recess 106 disposed in the first resist surface 102. A bottom 108 of the recess 106 may include a second resist surface 104. One or more conductive contacts 110 may be located at the first resist surface 102, and one or more conductive contacts 112 may be located at the second resist surface 104. The first resist surface 102 and the second resist surface 104 may be formed on a build-up material 190, and may be patterned to expose the conductive contacts 110 and 112, respectively, in accordance with any suitable known technique. In some embodiments, the conductive contacts 112 may provide first layer interconnects (FLI) and the conductive contacts 110 may provide package-on-package interconnects. Any suitable build-up material may be used for the build-up materials discussed herein, such as Ajinomoto build-up film (ABF) and prepreg build-up film. The build-up material 190 may include further structures therein, such as vias, conductive contacts, other devices, or any other suitable electrical or insulative structure (some non-limiting examples of which are shown).

The IC package 100 may have a core, or may be a coreless package. The recess 106 may have a depth 198 (measured between a "top" of the first resist surface 102 and a "top" of the second resist surface 104). The depth 198 of the recess 106 may take any suitable value (and as discussed below with reference to FIGS. 3-14, may be readily adjusted by changing the build-up thickness or the number of stack ups during manufacturing). For example, in some embodiments, the recess 106 may have a depth 198 between 50 microns and 300 microns.

In some embodiments, at least two conductive contacts 112 may be located at the second resist surface 104, and may be spaced apart by a distance 194 of less than 35 microns, although any suitable spacing may be used. In some embodiments, the distance 194 may be between 30 microns and 200 microns. In some embodiments, at least two conductive contacts 110 may dispose of the first resist surface 102, and may be spaced apart by a distance 192 of less than 35 microns, although any suitable spacing may be used (for example, between 100 and 400 microns). One or more of the conductive contacts 110 and the conductive contacts 112 may be formed from copper (e.g., as copper pads).

Figure 2:
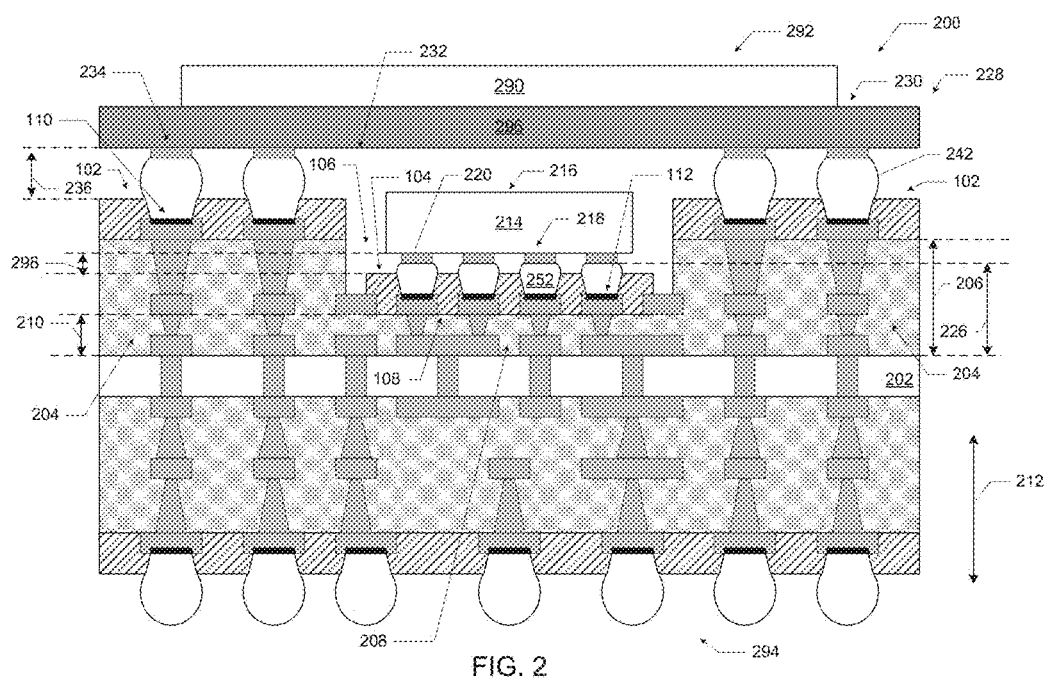
FIG. 2 is a cross-sectional side view of a portion of an integrated circuit (IC) structure with a package on package (PoP) structure, in accordance with various embodiments.

FIG. 2 is a cross-sectional side view of a portion of an IC structure 200 with a PoP structure, in accordance with various embodiments. The IC structure 200 may include an embodiment of the IC package 100, as illustrated. The IC package 100 illustrated in FIG. 2 may include a core 202 with build-up material and conductive structures on both sides 292 and 294 of the core 202. Vias and other conductive elements may allow electrical signals to travel from one side of the core to the other. Although the IC structure 200 of FIG. 2 is shown as having a core, the structures discussed with reference to the IC structure 200 (in particular, the structures discussed with reference to the side 292 of the IC structure 200) may be used to form a coreless IC structure, and coreless embodiments are readily formed using the techniques disclosed herein. Additionally, although a particular number of IC packages are illustrated in FIG. 2, the techniques disclosed herein may be utilized to form an IC structure having fewer or more packages (e.g., disposed in recesses) as desired. Examples of some such embodiments are discussed below with reference to FIGS. 17-18.

As discussed above with reference to FIG. 1, the IC package 100 of FIG. 2 may have a first resist surface 102 and a recess 106 disposed in the first resist surface 102. A bottom 108 of the recess 106 may include a second resist surface 104. One or more conductive contact 110 may be located at the first resist surface 102, and one or more conductive contacts 112 may be located at the second resist surface 104.

The IC package 100 may include a first build-up portion 204 disposed between the core 202 and the first resist surface 102 along an axis 212. The first build-up portion 204 may have a distance 206 (measured along the axis 212 between the core 202 and the first resist surface 102). The IC package 100 may include a second build-up portion 208 disposed between the core 202 and the second resist surface 104 along the axis 212. The first build-up portion 204 and the second build-up portion 208 may be formed using a sequence of build-up deposition operations, as discussed below with reference to FIGS. 3-6. In particular, a first phase of build-up may provide the second build-up portion 208, while the first build-up portion 204 may be provided by a combination of the first phase of build-up and a second phase of build-up that follows the first phase of build-up. The second build-up portion 208 may have a thickness 210 (measured along the axis 212 between the core 202 and the second resist surface 104). The distance 206 may be greater than the thickness 210. As illustrated in FIG. 2, the first build-up portion 204 may include a number of electrical structures, such as vias and conductive pads, arranged therein and in electrical contact with the conductive contacts 110. The second build-up portion 208 may also include a number of electrical structures, such as vias and conductive pads, arranged therein and in electrical contact with the conductive contacts 112.

The IC structure 200 of FIG. 2 also includes an IC component 214 arranged on the side 292 of the core 202. The IC component 214 may be any suitable IC component, such as a system on chip (SoC), an application processor, etc. In some embodiments, the IC component 214 may be a bare die. In other embodiments, the IC component 214 may be a wafer-level chip-size package. The IC component 214 may have a first surface 216, a second surface 218 disposed opposite the first surface 216, and one or more conductive contacts 220 located at the second surface 218. The IC component 214 may be located at least partially in the recess 106 and arranged such that one or more of the conductive contacts 220 of the IC component 214 are coupled to a corresponding one or more of the conductive contacts 112 of the IC package 100. In particular, the conductive contacts 220 may be disposed between the conductive contacts 112 and the first surface 216 of the IC structure 200. In FIG. 2, the conductive contacts 220 are illustrated as coupled to the conductive contacts 112 via solder balls 252 disposed on the conductive contacts 112 of the second resist surface 104 (e.g., in the apertures formed by the patterned second resist surface 104).

The thickness of the first build-up portion 204 (represented by the distance 206) may be the distance by which the conductive contacts 110 are spaced away from the core 202. When the IC component 214 is coupled to the IC package 100, the conductive contacts 220 may be spaced away from the core 202 by a distance 226. In some embodiments, the distance 226 may be less than the distance 206.

The IC structure 200 of FIG. 2 also includes an IC package 228 arranged on the side 292 of the core 202. The IC package 228 may be any suitable IC package, such as a memory device. The IC package 228 may include a package substrate 296 on which a die 290 is disposed. The die 290 may be, for example, a silicon chip, and may be coupled to the package substrate 296 via wirebonding, flip chip coupling, or any other suitable technique. In some embodiments, the die 290 may be overmolded with an epoxy mold compound (not shown). In some embodiments, multiple dies 290 or other components may be disposed on the IC package 228.

The IC package 228 may have a first surface 230, a second surface 232 disposed opposite the first surface 230, and one or more conductive contacts 234 located at the second surface 232. The IC package 228 may be coupled to the IC package 100 so that the IC component 214 is disposed between the IC package 100 and the IC package 228. In particular, one or more of the conductive contacts 234 may be coupled to a corresponding one or more of the conductive contacts 110. In particular, the conductive contacts 234 may be disposed between the conductive contacts 110 and the first surface 230 of the IC package 228. In FIG. 2, the conductive contacts 234 are illustrated as coupled to the conductive contacts 110 via solder balls 242 disposed on the conductive contacts 110 of the first resist surface 102 (e.g., in the apertures formed by the patterned first resist surface 102).

The second surface 232 of the IC package 228 may be spaced away from the first resist surface 102 of the IC package 100 by a distance 236. The first surface 216 of the IC component 214 may be spaced away from the second resist surface 104 of the IC package 100 by a distance 298. In some embodiments, the distance 236 may be less than the distance 298. In some embodiments, the distance 236 may be less than 250 microns.

As noted above, the depth of the recess 106 may take any suitable value. In particular, the depth of the recess 106 may be selected in view of the height of an IC component to be disposed in the recess 106 (e.g., the IC component 214) and/or the anticipated spacing between the IC package 100 and another IC package coupled to the conductive contacts 110 of the first resist surface 102 (e.g., the IC package 228). In some embodiments, the recess 106 may be deep enough so that the first surface 216 of the IC component 214 may be disposed "below" the level of the first resist surface 102. In other embodiments (such as the embodiment illustrated in FIG. 2), the first surface 216 of the IC component 214 may be arranged "above" the level of the first resist surface 102.

FIGS. 3-12 are cross-sectional side views of IC structures at various stages in a production sequence, in accordance with various embodiments. In particular, the production sequence illustrated by FIGS. 3-12 is shown as producing the IC package 100 of FIG. 2. However, this is simply illustrative, and the operations discussed below with reference to FIGS. 3-12 may be used to manufacture any suitable IC structure. Additionally, various production operations will be discussed as performed on one side of a structure with a core, but various operations will also be illustrated as performed on the other side of the structure. It will be understood by one of skill in the art that any suitable operations may be performed on either side of the structure to form any suitable structure. Additionally, although the various production operations discussed below with reference to FIGS. 3-12 are discussed in a particular order, the production operations may be performed in any suitable order.

Figure 3:
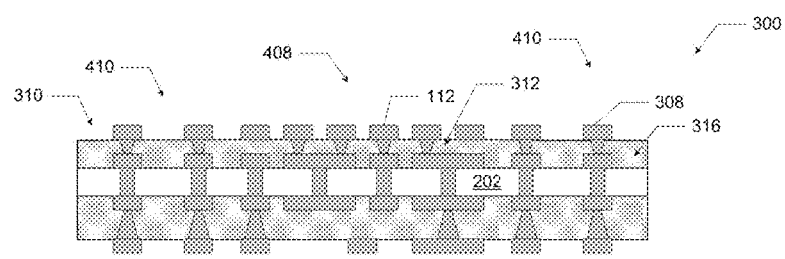
FIGS. 3-12 are cross-sectional side views of IC structures at various stages in a production sequence, in accordance with various embodiments.

FIG. 3 illustrates a structure 300 including a core 202 having a build-up material 316 and electrical structures 312 arranged therein. The structure 300 may also include electrical structures extending through the core 202 to electrically couple components on either side of the core 202. The structure 300 may include one or more conductive contacts 112 disposed in a first region 408 at a surface 310 and one or more conductive material portions 308 disposed in a second region 410 at the surface 310. The conductive contacts 112 and the conductive material portions 308 may be formed of the same material (e.g., copper). The first region 408 and the second region 410 may be nonoverlapping on the surface 310. The structure 300 may be formed using any suitable conventional substrate build process.

Figure 4:
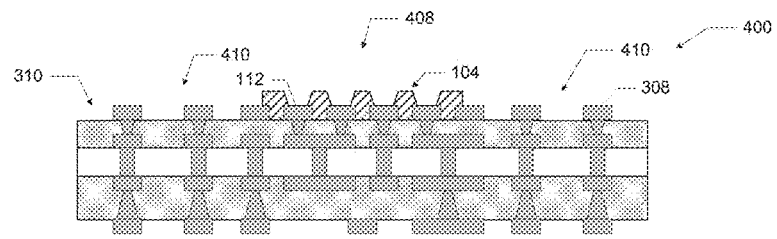

FIG. 4 illustrates a structure 400 subsequent to providing solder resist over at least some of the first region 408 of the surface 310 of the structure 300 to form a second resist surface 104. The second resist surface 104 may be patterned to surround the conductive contacts 112 and expose the conductive contacts 112. The second resist surface 104 may not be in contact with the conductive material portions 308 in the second region 410.

Figure 5:
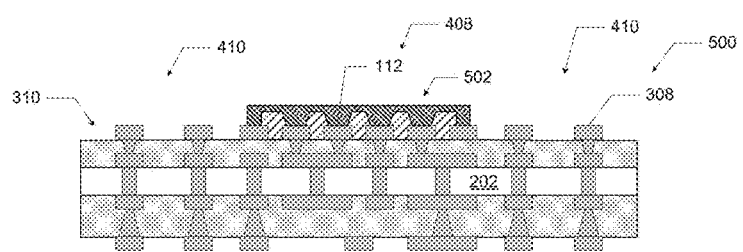

FIG. 5 illustrates a structure 500 subsequent to providing a release layer 502 over the first region 408 of the structure 400 such that the second resist surface 104 is disposed between the release layer 502 and the core 202. The release layer 502 may not be in contact with the conductive material portions 308 in the second region 410. In some embodiments, providing the release layer 502 may include paste printing the release layer 502. In other embodiments, providing the release layer 502 may include laminating the release layer 502. The material used for the release layer 502 may have weak adhesion to the second resist surface 104 and the conductive contacts 112 so that it can be readily removed in later manufacturing operations (e.g., as discussed below with reference to FIG. 9). Any suitable release material may be used for the release layers disclosed herein, such as epoxy, silicone or paraffin-based resins with carbon-based particles or fibers. The release material may have poor adhesion with build-up film (e.g., prepreg film) and copper.

Figure 6:
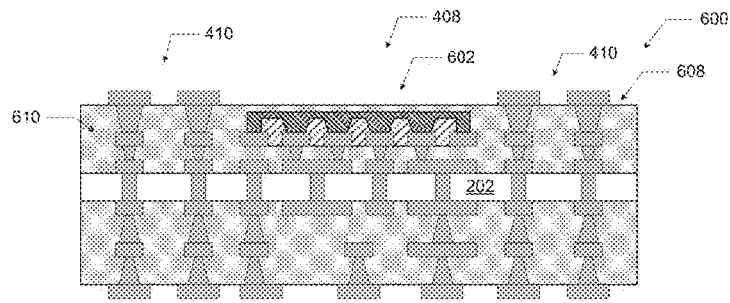

FIG. 6 illustrates a structure 600 subsequent to providing a build-up material to the structure 500 and forming additional conductive structures 610 and conductive contacts 110. In particular, the build-up material may include build-up material 602 provided to the first region 408 and build-up material 608 provided over the second region 410. Although the build-up material 602 and the build-up material 608 are separately identified, the build-up material 602 and the build-up material 608 may be provided in a continuous and/or common manufacturing operation or operations. The build-up material 602 may be provided such that the release layer 502 is disposed between the build-up material 602 and the core 202. The conductive structures 610 (e.g., conductive pads and vias) may be formed alternatingly with the provision of build-up material (e.g., by depositing build-up material, drilling out or otherwise removing a portion of the build-up material, forming the conductive structure, then repeating the process). The conductive contacts 110 may be formed over the second region 410. No conductive contacts or other conductive structures may be formed in or on the build-up material 602 disposed "above" the release layer 502.

Figure 7:
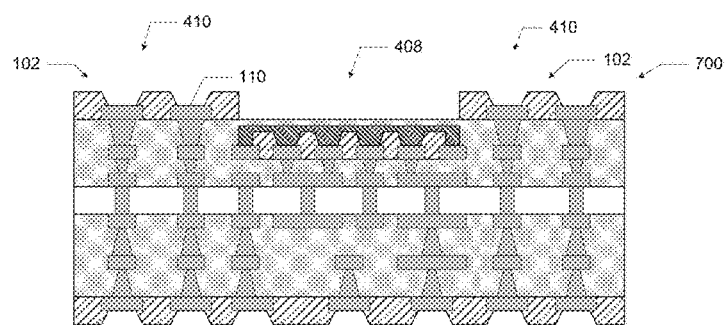

FIG. 7 illustrates a structure 700 subsequent to forming the first resist surface 102 on the structure 600. As discussed above with reference to FIGS. 1 and 2, the first resist surface 102 may be patterned to expose the conductive contacts 110 over the second region 410. No solder resist may be applied over the first region 408.

Figure 8:
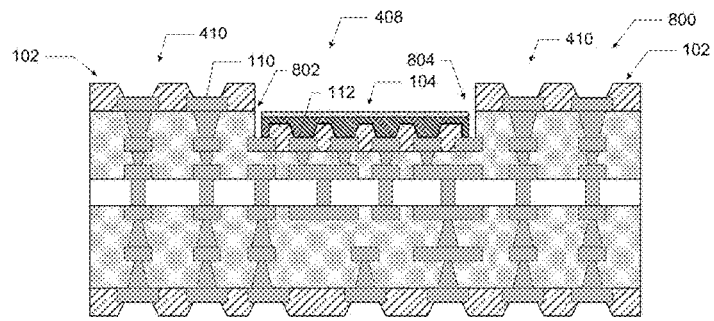

FIG. 8 illustrates a structure 800 subsequent to cutting the build-up material 602 of the structure 700 over the first region 408 down to and including the release layer 502. In some embodiments, cutting the build-up material 602 may be performed by laser cutting the build-up material 602 at a boundary of the first region. In some embodiments, the laser energy used to cut the build-up material 602 and the release layer 502 may cut through the release layer 502 and stop upon reaching a hard metal (e.g., copper of the conductive contacts 112). The depth to which cutting can occur may depend on the power of the laser used to perform the cutting. In other embodiments, cutting the build-up material 602 may be performed by mechanically routing the build-up material 602 at a boundary of the first region. Note that FIG. 8 is a cross-sectional side view of a structure; when viewed from the "top," the build-up material 602 may be cut to form any desired shape (e.g., a rectangle), and thereby to form a recess having any desired footprint, as discussed below.

Figure 9:
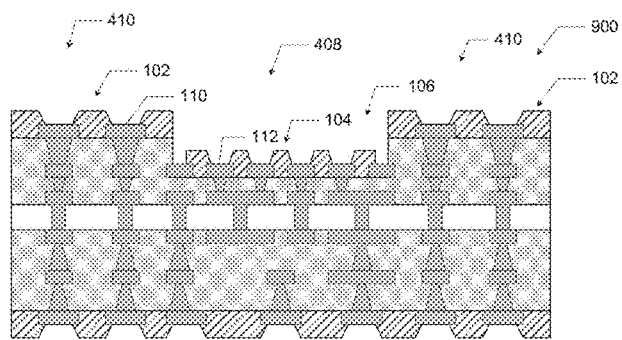

FIG. 9 illustrates a structure 900 subsequent to removing the release layer 502 and the build-up material 602 disposed on the release layer 502 of the structure 800. When the edges of the release layer 502 are exposed after the cutting, the release layer 502 may be mechanically lifted and "peeled" away from the second resist surface 104, removing the build-up material 602 at the same time. When the release layer 502 and the build-up material 602 are removed, a recess 106 may be formed and the conductive contacts 112 may be exposed at the bottom 108 of the recess 106, with the solder resist over the first region 408 providing the second resist surface 104. The structure 900 may be an embodiment of the IC package 100 discussed above with reference to FIG. 1. In particular, the structure 900 may form an IC package having a first resist surface 102, a recess 106 having a second resist surface 104 at the bottom 108, one or more conductive contacts 110 located at the first resist surface 102, and one or more conductive contacts 112 located at the second resist surface 104. The depth of the recess 106 is a function of the thickness of the build-up material 602 disposed on the release layer 502. Thus, the depth of the recess 106 may be set during manufacturing by adjusting the thickness of the build-up material deposited with each layer and/or the number of layers (e.g., the number of stack ups) formed after depositing the release layer 502.

Figure 10:
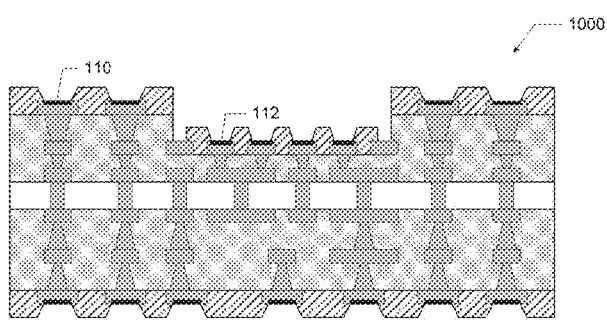

FIG. 10 illustrates a structure 1000 subsequent to surface finishing the structure 900. In some embodiments, surface finishing may include application of a nickel-palladium-gold (NiPdAu) finish or copper organic solderability preservative (CuOSP) finish, in accordance with known techniques. In particular, the exposed surfaces of the conductive contacts 110 and the conductive contacts 112 may be surface finished. Other portions of the structure 1000 may be surface finished as well (e.g., the second-level interconnects (SLI) on the "bottom" of the structure 1000). The structure 1000 may be an embodiment of the IC package 100 discussed above with reference to FIG. 1. In particular, the structure 1000 may form an IC package having a first resist surface 102, a recess 106 having a second resist surface 104 at the bottom 108, one or more conductive contacts 110 located at the first resist surface 102, and one or more conductive contacts 112 located at the second resist surface 104.

Figure 11:
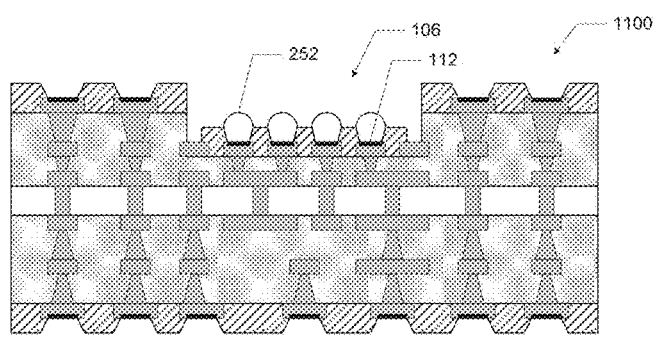

FIG. 11 illustrates a structure 1100 subsequent to providing solder balls 252 to the conductive contacts 112 in the recess 106. The solder balls 252 may be provided using conventional techniques such as microball bumping or paste printing bumping. The structure 1100 may be an embodiment of the IC package 100 discussed above with reference to FIG. 1. In particular, the structure 1100 may form an IC package having a first resist surface 102, a recess 106 having a second resist surface 104 at the bottom 108, one or more conductive contacts 110 located at the first resist surface 102, and one or more conductive contacts 112 located at the second resist surface 104.

Figure 12:
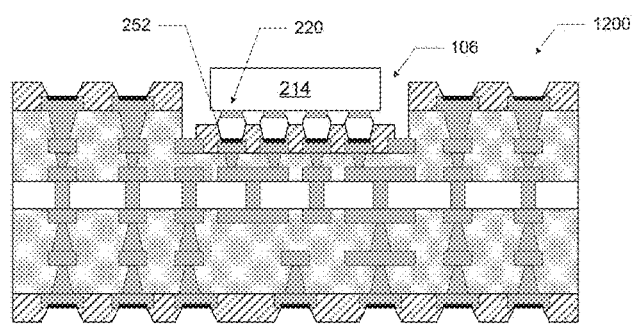

FIG. 12 illustrates a structure 1200 subsequent to coupling an IC component 214 to the structure 1100 via the solder balls 252. The IC component 214 may be disposed in the recess 106, and may include conductive contacts 220 that are electrically coupled to the conductive contacts 112 via the solder balls 252. The structure 1200 may be an embodiment of the IC package 100 discussed above with reference to FIG. 1. In particular, the structure 1200 may form an IC package having a first resist surface 102, a recess 106 having a second resist surface 104 at the bottom 108, one or more conductive contacts 110 located at the first resist surface 102, and one or more conductive contacts 112 located at the second resist surface 104.

Figure 13:
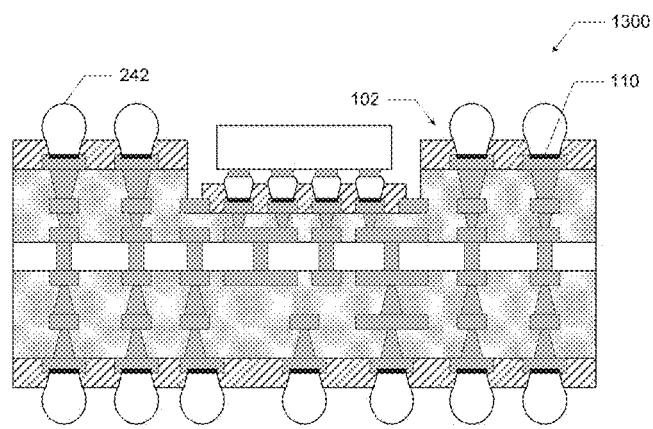
FIGS. 13-14 are cross-sectional side views of IC structures at various stages in an assembly sequence, in accordance with various embodiments.
Figure 14:
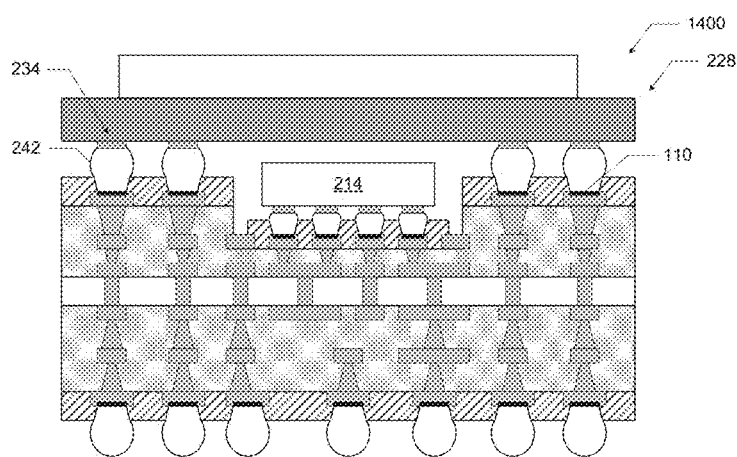

FIGS. 13-14 are cross-sectional side views of IC structures at various stages in an assembly sequence, in accordance with various embodiments. In particular, the assembly sequence illustrated by FIGS. 13-14 is shown as producing the IC structure 200 of FIG. 2. However, this is simply illustrative, and the operations discussed below with reference to FIGS. 13-14 may be used to manufacture any suitable IC structure. Additionally, various production operations will be discussed as performed on one side of a structure with a core, but various operations will also be illustrated as performed on the other side of the structure. It will be understood by one of skill in the art that any suitable operations may be performed on either side of the structure to form any suitable structure.

FIG. 13 illustrates a structure 1300 subsequent to providing solder balls 242 to the conductive contacts 110 at the first resist surface 102. The solder balls 242 may be provided using conventional techniques, such as ball grid array (BGA) attachment. The structure 1300 may be an embodiment of the IC package 100 discussed above with reference to FIG. 1. In particular, the structure 1300 may form an IC package having a first resist surface 102, a recess 106 having a second resist surface 104 at the bottom 108, one or more conductive contacts 110 located at the first resist surface 102, and one or more conductive contacts 112 located at the second resist surface 104.

FIG. 14 illustrates a structure 1400 subsequent to coupling an IC package 228 to the structure 1300 via the solder balls 242. The IC package 228 may include conductive contacts 234 that are electrically coupled to the conductive contacts 110 via the solder balls 242. The structure 1400 may take the form of any of the embodiments of the IC structure 200 discussed above with reference to FIG. 2. The structure 1400 may also be an embodiment of the IC package 100 discussed above with reference to FIG. 1. In particular, the structure 1400 may form an IC package having a first resist surface 102, a recess 106 having a second resist surface 104 at the bottom 108, one or more conductive contacts 110 located at the first resist surface 102, and one or more conductive contacts 112 located at the second resist surface 104.

Figure 15:
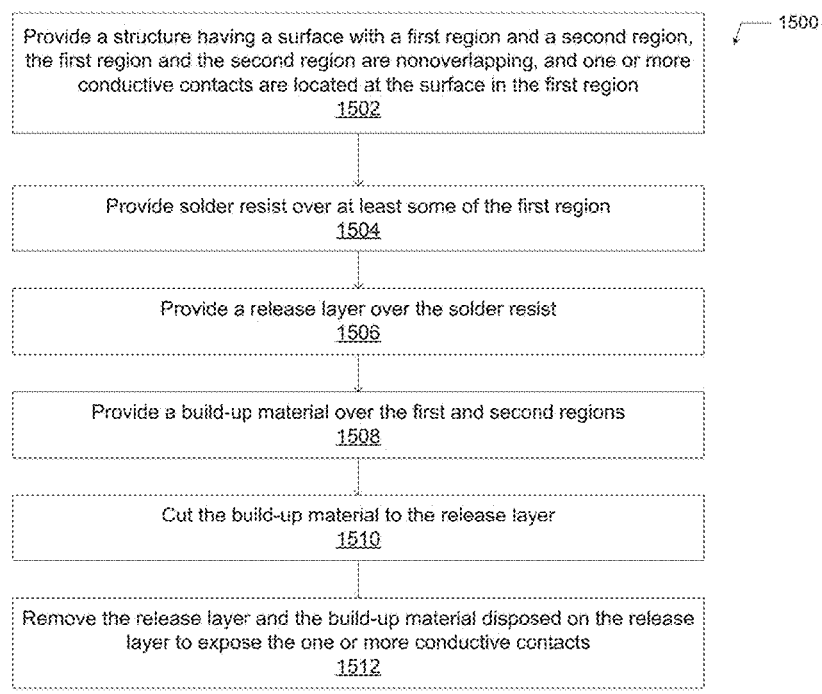
FIG. 15 is a flow diagram of a method of manufacturing an IC package, in accordance with various embodiments.

FIG. 15 is a flow diagram of a method 1500 of manufacturing an IC package, in accordance with various embodiments. Although operations of the method 1500 may be discussed with reference to the IC package 100 and components thereof, this is simply for illustrative purposes and the method 1500 may be utilized to form any suitable IC package.

At 1502, a structure may be provided (e.g., the structure 300 of FIG. 3). The structure may have a surface having a first region and a second region (e.g., the first region 408 and the second region 410 of the surface 310 of FIG. 3). The first region and the second region may be nonoverlapping, and one or more conductive contacts may be located at the surface in the first region (e.g., the one or more conductive contacts 112 of FIG. 3).

At 1504, a solder resist may be provided over at least some of the first region of the surface (e.g., the second resist surface 104 of the structure 400 of FIG. 4).

At 1506, a release layer may be provided over the solder resist (e.g., the release layer 502 of the structure 500 of FIG. 5). In some embodiments, 1506 may include paste printing the release layer. In some embodiments, 1506 may include laminating the release layer.

At 1508, a build-up material may be provided to the first and second regions (e.g., the build-up material 602 and 608 of the first region 408 and the second region 410, respectively, of the structure 600 of FIG. 6).

At 1510, the build-up material and the release layer may be cut (e.g., cut through the release layer 502 as illustrated with reference to the structure 800 of FIG. 8). In some embodiments, 1510 may include laser cutting or mechanically routing the build-up material and the release layer at a boundary of the first region.

At 1512, the release layer and the build-up material disposed on the release layer may be removed to expose the one or more conductive contacts (e.g., as discussed above with reference to the structure 900 of FIG. 9).

In some embodiments, the method 1500 may also include, after providing the build-up material at 1508 and before cutting the build-up material at 1510, forming one or more conductive vias in the build-up material in the second region (e.g., as discussed above with reference to FIG. 6). In some such embodiments, the method 1500 may also include forming a plurality of conductive contacts in the second region after forming a plurality of conductive vias, and providing solder balls to the conductive contacts formed into the conductive contacts exposed at 1512.

Figure 16:
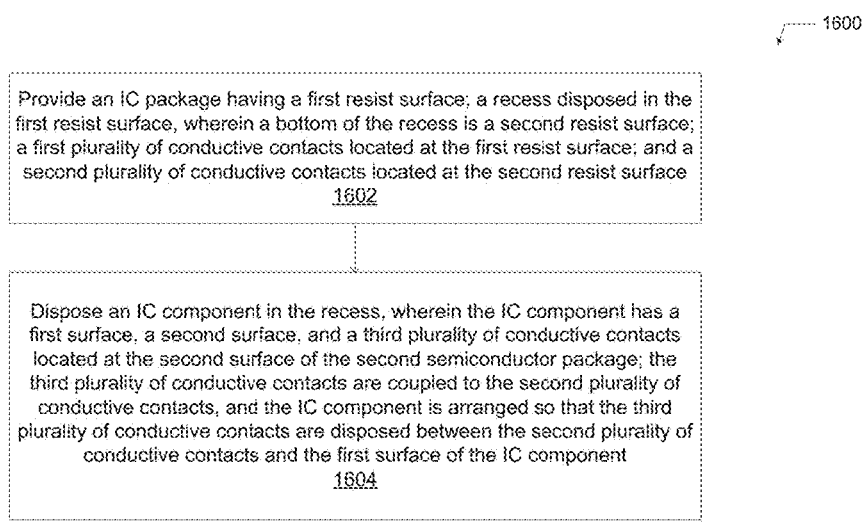
FIG. 16 is a flow diagram of a method of manufacturing an IC structure with a PoP structure, in accordance with various embodiments.

FIG. 16 is a flow diagram of a method 1600 of manufacturing an IC structure having a PoP structure, in accordance with various embodiments. Although operations of the method 1600 may be discussed with reference to the IC structure 200 and components thereof, this is simply for illustrative purposes and the method 1500 may be utilized to form any suitable IC structure.

At 1602, an IC package may be provided (e.g., the IC package 100 of FIG. 1 or the IC structure 900 of FIG. 9). The IC package provided at 1602 may have a first resist surface; a recess disposed in the first resist surface, wherein a bottom of the recess is a second resist surface; a first plurality of conductive contacts located at the first resist surface; and a second plurality of conductive contacts located at the second resist surface (e.g., the recess 106 disposed in the first resist surface 102, the bottom 108 of the recess 106 providing the second resist surface 104, the first plurality of conductive contacts 110, and the second plurality of conductive contacts 112).

At 1604, an IC component may be disposed in the recess (e.g., the IC component 214 disposed in the recess 106 of FIG. 2 or FIG. 12). The IC component may have a first surface, a second surface, and a third plurality of conductive contacts located at the second surface (e.g., the first surface 216, the second surface 218, and the third plurality of conductive contacts 220). The third plurality of conductive contacts may be coupled to the second plurality of conductive contacts of the IC package, and the IC component may be arranged so that the third plurality of conductive contacts are disposed between the second plurality of conductive contacts and the first surface of the IC component (e.g., as illustrated in FIGS. 2 and 12).

In some embodiments, the IC package of the method 1600 may be a first IC package, and the method 1600 may also include, after disposing the IC component in the recess, attaching a second IC package (e.g., the IC package 228) to the first IC package. The second IC package may have a first surface, a second surface, and a fourth plurality of conductive contacts located at the second surface of the second IC package (e.g., the first surface 230, the second surface 232, and the conductive contacts 234 of FIG. 2). The fourth plurality of conductive contacts may be coupled to the first plurality of conductive contacts, and the second IC package may be arranged so that the IC component is disposed between the first IC package and the second surface of the second IC package.

Figure 17:
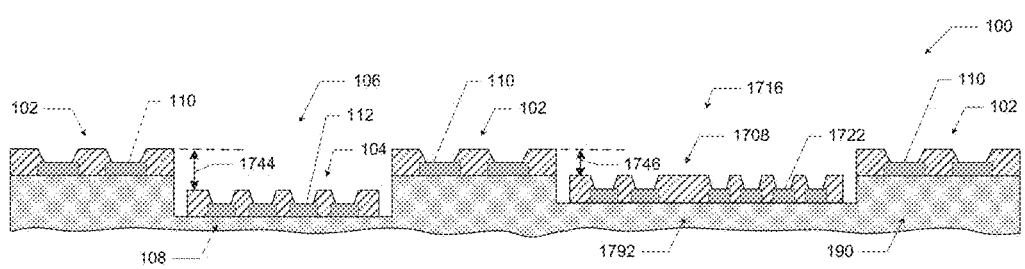
FIG. 17 is a cross-sectional side view of a portion of an IC package, in accordance with various embodiments.

Various embodiments of the IC packages disclosed herein may include multiple recesses having conductive contacts located at the bottom. For example, FIG. 17 is a cross-sectional side view of a portion of an IC package 100, in accordance with various embodiments. The IC package 100 of FIG. 17, like the IC package 100 of FIG. 1, may have a first resist surface 102 and a recess 106 disposed in the first resist surface 102. A bottom 108 of the recess 106 may include a second resist surface 104. One or more conductive contacts 110 may be located at the first resist surface 102, and one or more conductive contacts 112 may be located at the second resist surface 104. The first resist surface 102 and the second resist surface 104 may be formed on a build-up material 190, and may be patterned to expose the conductive contacts 110 and 112, respectively, in accordance with any suitable known technique. The build-up material 190 may include further structures therein, such as vias, conductive contacts, other devices, or any other suitable electrical or insulative structure (not shown for ease of illustration).

Additionally, the IC package 100 of FIG. 17 may include an additional recess 1716 disposed in the first resist surface 102. A bottom 1792 of the recess 1716 may include a third resist surface 1708. One or more conductive contacts 1722 may be located at the third resist surface 1708. Any desired number of conductive contacts 1722 may be located at the third resist surface 1708 in any desired arrangement (e.g., as discussed below with reference to FIG. 18). The third resist surface 1708 may be formed on the build-up material 190, and may be patterned to expose the conductive contacts 1722 in accordance with any suitable known technique. The recess 106 may have a depth 1744 and the recess 1716 may have a depth 1746. In some embodiments, the depth 1744 and the depth 1746 may be different. For example, as illustrated in FIG. 17, the depth 1746 may be less than the depth 1744. The recesses, resist surfaces, and conductive contacts of the IC package 1700 may take the form of any of the embodiments of the IC package 100 disclosed herein.

Figure 18:
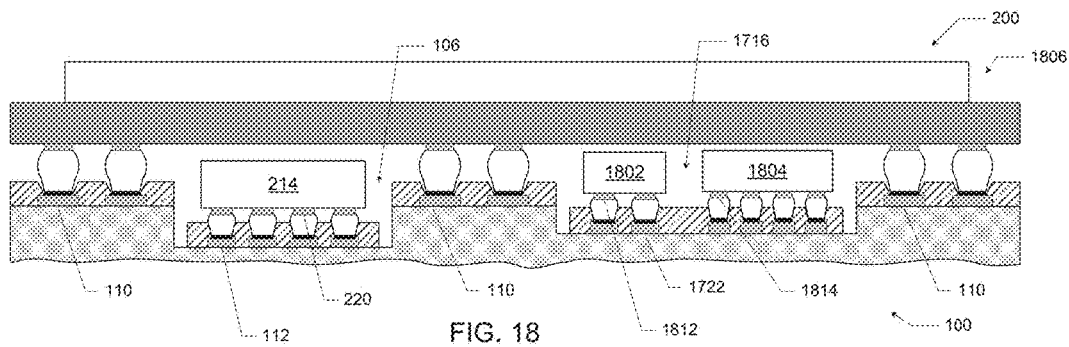
FIG. 18 is a cross-sectional side view of a portion of an IC structure with a PoP structure, in accordance with various embodiments.

Various embodiments of the IC structures disclosed herein may include IC packages having multiple recesses with conductive contacts located at the bottom and/or multiple IC components disposed in a single recess in a PoP structure. For example, FIG. 18 is a cross-sectional side view of a portion of an IC structure 200, in accordance with various embodiments. The IC structure 200 of FIG. 18 may, like the IC structure 200 of FIG. 2, include an embodiment of the IC package 100 (as illustrated, the IC package 100 of FIG. 17).

The IC structure 200 of FIG. 18 includes an IC component 214 located at least partially in the recess 106 and arranged such that one or more of the conductive contacts 220 of the IC component 214 are coupled to a corresponding one or more of the conductive contacts 112 of the IC package 100 (e.g., in accordance with any of the embodiments discussed above with reference to FIG. 2).

The IC structure 200 of FIG. 18 includes an IC component 1802 and an IC component 1804 located at least partially in the recess 1716. The IC component 1802 and the IC component 1804 may be adjacent to each other in the recess 1716. The IC component 1802 may include one or more conductive contacts 1812 (e.g., as discussed above with reference to the conductive contacts 112 of the IC component 214) and may be arranged such that one or more of the conductive contacts 1812 of the IC component 1802 are coupled to a corresponding one or more of the conductive contacts 1722 of the IC package 100 (e.g., in accordance with any of the embodiments discussed above with reference to FIG. 2). The IC component 1804 may include one or more conductive contacts 1814 (e.g., as discussed above with reference to the conductive contacts 112 of the IC component 214) and may be arranged such that one or more of the conductive contacts 1814 of the IC component 1804 are coupled to a corresponding one or more of the conductive contacts 1722 of the IC package 100 (e.g., in accordance with any of the embodiments discussed above with reference to FIG. 2). An IC package 1806 may be included in the IC structure 200 such that the IC components 1802, 1804, and 214 are disposed between the IC package 100 and the IC package 1806 (e.g., as discussed above with reference to the IC package 228 of FIG. 2).

Figure 19:
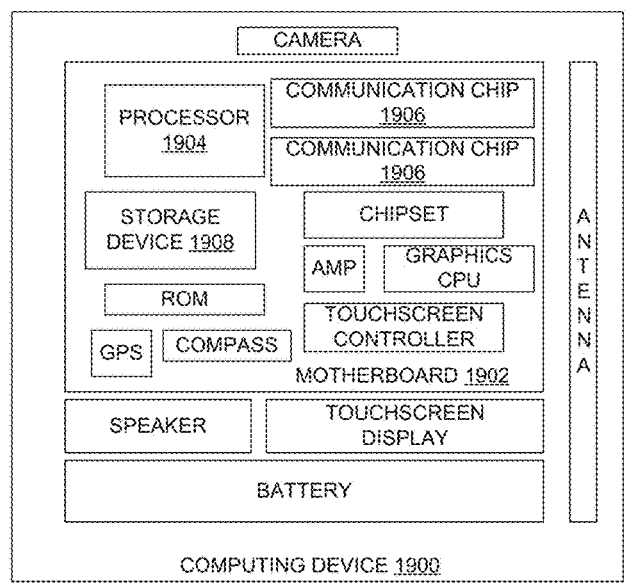
FIG. 19 is a block diagram of an example computing device that may include one or more of any of the IC packages and structures disclosed herein.

Embodiments of the present disclosure may be implemented into a system using any IC packages or package structures that may benefit from the recessed conductive contacts and manufacturing techniques disclosed herein. FIG. 19 schematically illustrates a computing device 1900, in accordance with some implementations, which may include IC packages or package structures having recessed conductive contacts formed in accordance with any of the embodiments disclosed herein. For example, the IC packages 100 of FIGS. 1 and 17, or the IC structures 200 of FIGS. 2 and 18, may be configured to include a storage device 1908, a processor 1904, or a communication chip 1906 of the computing device 1900 (discussed below).

The computing device 1900 may be, for example, a mobile communication device or a desktop or rack-based computing device. The computing device 1900 may house a board such as a motherboard 1902. The motherboard 1902 may include a number of components, including (but not limited to) a processor 1904 and at least one communication chip 1906. Any of the components discussed herein with reference to the computing device 1900 may be arranged in a package-on-package structure in accordance with the techniques disclosed herein. In further implementations, the communication chip 1906 may be part of the processor 1904.

The computing device 1900 may include a storage device 1908. In some embodiments, the storage device 1908 may include one or more solid state drives. Examples of storage devices that may be included in the storage device 1908 include volatile memory (e.g., dynamic random access memory (DRAM)), non-volatile memory (e.g., read-only memory, ROM), flash memory, and mass storage devices (such as hard disk drives, compact discs (CDs), digital versatile discs (DVDs), and so forth).

Depending on its applications, the computing device 1900 may include other components that may or may not be physically and electrically coupled to the motherboard 1902. These other components may include, but are not limited to, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

The communication chip 1906 and the antenna may enable wireless communications for the transfer of data to and from the computing device 1900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1906 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wide region (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1906 may operate in accordance with a Global System for Mobile Communications (GSM), General Packet Radio Service (GPRS), Universal Mobile Telecommunications System (UMTS), High Speed Packet Access (HSPA), Evolved HSPA (E-HSPA), or LTE network. The communication chip 1906 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1906 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1906 may operate in accordance with other wireless protocols in other embodiments.

The computing device 1900 may include a plurality of communication chips 1906. For instance, a first communication chip 1906 may be dedicated to shorter range wireless communications such as Wi-Fi and Bluetooth, and a second communication chip 1906 may be dedicated to longer range wireless communications such as GPS, EDGE, GPRS, CDMA, WiMAX, LTE, EV-DO, and others. In some embodiments, the communication chip 1906 may support wired communications. For example, the computing device 1900 may include one or more wired servers.

The processor 1904 and/or the communication chip 1906 of the computing device 1900 may include one or more dies or other components in an integrated circuit (IC) package. Such an IC package may be coupled with another IC component and/or IC package using any of the techniques disclosed herein (e.g., using the recess structures disclosed herein). The term "processor" may refer to any device or portion of a device that processes electronic data from registers and/or memory to transform that electronic data into other electronic data that may be stored in registers and/or memory.

In various implementations, the computing device 1900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1900 may be any other electronic device that processes data. In some embodiments, the recessed conductive contacts disclosed herein may be implemented in a high-performance computing device.

The following paragraphs provide examples of the embodiments disclosed herein.

Example 1 is an IC structure, including: an IC package having a first resist surface; a recess disposed in the first resist surface, wherein a bottom of the recess includes a second resist surface; a first plurality of conductive contacts located at the first resist surface; and a second plurality of conductive contacts located at the second resist surface.

Example 2 may include the subject matter of Example 1, and may further specify that: the IC package further comprises a first build-up portion disposed between a core of the IC package and the first resist surface along an axis, and a second build-up portion disposed between the core of the IC package and the second resist surface along the axis; and a thickness of the first build-up portion along the axis is greater than a thickness of the second build-up portion along the axis.

Example 3 may include the subject matter of any of Examples 1-2, and may further include: an IC component having a first surface, a second surface opposite to the first surface of the IC component, and a third plurality of conductive contacts located at the second surface of the IC component; wherein the third plurality of conductive contacts are coupled to the second plurality of conductive contacts and the IC component is arranged so that the third plurality of conductive contacts are disposed between the second plurality of conductive contacts and the first surface of the IC component.

Example 4 may include the subject matter of Example 3, and may further specify that at least two of the second plurality of conductive contacts are spaced apart by a distance of less than 35 microns.

Example 5 may include the subject matter of any of Examples 3-4, and may further specify that the first plurality of conductive contacts are spaced away from a core of the IC package by a first distance, the third plurality of conductive contacts are spaced away from the core of the IC package by a second distance, and the second distance is less than the first distance.

Example 6 may include the subject matter of any of Examples 3-5, and may further specify that the IC component is a system on chip.

Example 7 may include the subject matter of any of Examples 3-6, and may further specify that the IC package is a first IC package, and the IC structure further includes a second IC package having a first surface, a second surface opposite to the first surface of the second IC package, and a fourth plurality of conductive contacts located at the second surface of the second IC package; wherein the fourth plurality of conductive contacts are coupled to the first plurality of conductive contacts and the second IC package is arranged so that the IC component is disposed between the first IC package and the second surface of the second IC package.

Example 8 may include the subject matter of Example 7, and may further specify that the second surface of the second IC package is spaced away from the first resist surface of the first IC package by a first distance, the first surface of the IC component is spaced away from the second resist surface of the first IC package by a second distance, and the first distance is less than the second distance.

Example 9 may include the subject matter of any of Examples 7-8, and may further specify that at least two of the first plurality of conductive contacts are spaced apart by a distance of less than 35 microns.

Example 10 may include the subject matter of any of Examples 7-9, and may further include a solder ball in physical contact with one of the second plurality of conductive contacts and also in physical contact with one of the fourth plurality of conductive contacts.

Example 11 may include the subject matter of any of Examples 7-10, and may further specify that the second IC package is a memory device.

Example 12 may include the subject matter of any of Examples 7-11, and may further specify that a distance between the second surface of the second IC package and the first resist surface is less than 250 microns.

Example 13 may include the subject matter of any of Examples 1-11, and may further specify that the second plurality of conductive contacts comprises a plurality of copper pads.

Example 14 may include the subject matter of any of Examples 1-13, and may further specify that the IC package is coreless.

Example 15 is a method of manufacturing an IC package, including: providing a structure having a surface, wherein the surface has a first region and a second region, the first region and the second region are nonoverlapping on the surface, and a plurality of conductive contacts are located at the surface in the first region; providing solder resist over at least some of the first region; after providing the solder resist, providing a release layer over the first region; providing a build-up material over the first and second regions; cutting the build-up material and the release layer; and removing the release layer and the build-up material disposed on the release layer to expose the plurality of conductive contacts.

Example 16 may include the subject matter of Example 15, and may further specify that providing the release layer comprises paste printing the release layer.

Example 17 may include the subject matter of any of Examples 15-16, and may further specify that providing the release layer includes laminating a release layer.

Example 18 may include the subject matter of any of Examples 15-17, and may further specify that cutting the build-up material and the release layer includes laser cutting the build-up material and the release layer at a boundary of the first region.

Example 19 may include the subject matter of any of Examples 15-18, and may further include, after providing the build-up material and before cutting the build-up material, forming a plurality of conductive vias in the build-up material over the second region of the surface.

Example 20 may include the subject matter of Example 19, and may further include forming a second plurality of conductive contacts over the second region after forming the plurality of conductive vias, and providing solder balls to the first and second pluralities of conductive contacts.

Example 21 may include the subject matter of any of Examples 19-20, and may further specify that at least two of the plurality of conductive vias are spaced apart by a distance of less than 35 microns.

Example 22 is a method of manufacturing an integrated circuit (IC) structure, including: providing an IC package, including a substrate having a first resist surface, a recess disposed in the first resist surface, wherein a bottom of the recess is a second resist surface, a first plurality of conductive contacts located at the first resist surface, and a second plurality of conductive contacts located at the second resist surface; and disposing an IC component in the recess, wherein the IC component has a first surface, a second surface opposite to the first surface of the IC component, and a third plurality of conductive contacts located at the second surface of the IC component, the third plurality of conductive contacts are coupled to the second plurality of conductive contacts, and the IC component is arranged so that the third plurality of conductive contacts are disposed between the second plurality of conductive contacts and the first surface of the IC component.

Example 23 may include the subject matter of Example 22, and may further specify that the IC component is an application processor.

Example 24 may include the subject matter of any of Examples 22-23, and may further specify that the IC package is a first IC package, and the method further includes, after disposing the IC component in the recess, attaching a second IC package to the first IC package, wherein the second IC package has a first surface, a second surface opposite to the first surface of the second IC package, and a fourth plurality of conductive contacts located at the second surface of the second IC package, the fourth plurality of conductive contacts are coupled to the first plurality of conductive contacts, and the second IC package is arranged so that the IC component is disposed between the first IC package and the second surface of the second IC package.

Example 25 may include the subject matter of any of Examples 22-24, and may further specify that the recess has a depth between 50 microns and 300 microns.

What is claimed is:

1. An integrated circuit (IC) structure, comprising:
   a first IC package, including:
   a first resist surface provided with a first plurality of conductive contacts, a first recess disposed in the first resist surface, wherein the first recess includes a second resist surface disposed at a bottom of the first recess and provided with a second plurality of conductive contacts, and a second recess disposed in the first resist surface, wherein the second recess includes a third resist surface disposed at a bottom of the second recess and provided with a fourth plurality of conductive contacts;
   an IC component having a first surface, a second surface opposite to the first surface of the IC component, and a third plurality of conductive contacts located at the second surface of the IC component, wherein the third plurality of conductive contacts is coupled to the second plurality of conductive contacts of the first IC package; and
   a second IC package having a first surface, a second surface opposite to the first surface of the second IC package, and one or more conductive contacts located at the second surface of the second IC package, wherein the one or more conductive contacts is coupled to at least one of the first plurality of conductive contacts of the first IC package, on each side of the first recess.

2. The IC structure of claim 1, wherein the third plurality of conductive contacts are disposed between the second plurality of conductive contacts and the first surface of the IC component.

3. The IC structure of claim 1, wherein the IC package further comprises:
   a first build-up portion disposed between a core of the first IC package and the first resist surface along an axis substantially perpendicular to the core; and
   a second build-up portion disposed between the core of the first IC package and the second resist surface along the axis,
   wherein a thickness of the first build-up portion along the axis is greater than a thickness of the second build-up portion along the axis.

4. The IC structure of claim 1, wherein at least two of the second plurality of conductive contacts are spaced apart by a distance of less than 35 microns.

5. The IC structure of claim 1, wherein the first plurality of conductive contacts are spaced away from a core of the IC package by a first distance, the third plurality of conductive contacts are spaced away from the core of the IC package by a second distance, and the second distance is less than the first distance.

6. The IC structure of claim 1, wherein the IC component is a system on chip.

7. The IC structure of claim 1, wherein the second surface of the second IC package is spaced away from the first resist surface of the first IC package by a first distance, the first surface of the IC component is spaced away from the second resist surface of the first IC package by a second distance, and the first distance is less than the second distance.

8. The IC structure of claim 1, wherein at least two of the first plurality of conductive contacts are spaced apart by a distance of less than 35 microns.

9. The IC structure of claim 1, further comprising a solder ball in physical contact with one of the first plurality of conductive contacts and also in physical contact with one of the one or more conductive contacts located at the second surface of the second IC package.

10. The IC structure of claim 1, wherein the second IC package is a memory device.

11. The IC structure of claim 1, wherein a distance between the second surface of the second IC package and the first resist surface is less than 250 microns.

12. The IC structure of claim 1, wherein the second plurality of conductive contacts comprises a plurality of copper pads.

13. The IC structure of claim 1, wherein at least one of:
   the first IC package is coreless; or
   the second IC package is coreless.

14. The IC structure of claim 1, wherein the second IC package includes a package substrate, on which one or more dies are disposed.

15. The IC structure of claim 1, wherein the one or more conductive contacts located at the second surface of the second IC package are disposed between the first plurality of contacts and the first surface of the second IC package.

16. A method of manufacturing an integrated circuit (IC) package, comprising:
providing a first IC package including:
a first resist surface with a first plurality of conductive contacts, a first recess disposed in the first resist surface, wherein a bottom of the first recess is a second resist surface provided with a second plurality of conductive contacts, and a second recess disposed in the first resist surface, wherein a bottom of the second recess is a third resist surface provided with a fourth plurality of conductive contacts;
providing an IC component having a first surface and a second surface opposite to the first surface of the IC component, and a third plurality of conductive contacts located at the second surface of the IC component, the third plurality of conductive contacts coupled to the second plurality of conductive contacts;
providing a second IC package having a first surface, a second surface opposite to the first surface of the second IC package, and one or more conductive contacts located at the second surface of the second IC package; and
coupling the one or more conductive contacts at the second surface of the second IC package to at least one of the first plurality of conductive contacts of the first IC package, on each side of the first recess.

17. The method of claim 16, further comprising spacing the second surface of the second IC package away from the first resist surface of the first IC package by a first distance, and spacing the first surface of the IC component from the second resist surface of the first IC package by a second distance, wherein the first distance is less than the second distance.

18. The method of claim 16, further comprising spacing at least two of the first plurality of conductive contacts apart by a distance of less than 35 microns.

19. The method of claim 16, further comprising providing a solder ball in physical contact with one of the first plurality of conductive contacts and also in physical contact with one of the one or more conductive contacts on the second surface of the second IC package.

20. The method of claim 16, wherein the second IC package is a memory device.

21. The method of claim 16, further comprising providing the second IC package such that a distance between the second surface of the second IC package and the first resist surface is less than 250 microns.

22. The method of claim 16, wherein at least one of:
the first IC package is coreless; or
the second IC package is coreless.

23. The method of claim 16, wherein the second IC package includes a package substrate, on which one or more dies are disposed.

24. The method of claim 16, further comprising coupling the second IC package to the first IC package so that the one or more conductive contacts located at the second surface of the second IC package are disposed between the first plurality of contacts and the first surface of the second IC package.

25. The method of claim 16, wherein the recess has a depth of between 50 microns and 500 microns.

* * * * *